United States Patent [19]

Masaki

[11] 3,723,761

[45] Mar. 27, 1973

[54] EMITTER-EMITTER COUPLED LOGIC CIRCUIT DEVICE

[75] Inventor: Akira Masaki, Sagamihara, Japan

[73] Assignee: Hitachi, Ltd., Tokyo, Japan

[22] Filed: Sept. 21, 1971

[21] Appl. No.: 182,419

[52] U.S. Cl. ....................307/208, 307/215, 307/218

[51] Int. Cl. ............................................H03k 19/08

[58] Field of Search.......307/208, 215, 218, 213, 203

[56] References Cited

UNITED STATES PATENTS

| | | | |
|---|---|---|---|
| 3,283,180 | 11/1966 | Pressman | 307/215 |
| 3,549,899 | 12/1970 | Beelitz | 307/215 |
| 3,573,488 | 4/1971 | Beelitz | 307/215 X |

*Primary Examiner*—John Zazworsky

*Attorney*—Craig, Antonelli & Hill

[57] ABSTRACT

An emitter-emitter coupled logic circuit ($E^2CL$) capable of driving a distributed constant circuit load with a low power at a high speed. the $E^2CL$ comprises a conventional $E^2CL$ and a buffer circuit consisting of a pair of transistors the emitters of which are connected in common to an emitter voltage source. The bases of the pair of transistors are connected to the output terminals of the conventional $E^2CL$. The loads are connected to the collectors of the transistors of the buffer circuit. Each of the transistors may be provided with a saturation-proof diode connected between its base and collector.

6 Claims, 5 Drawing Figures

INVENTOR

AKIRA MASAKI

BY Craig, Antonelli & Hill

ATTORNEYS

INVENTOR

AKIRA MASAKI

BY Craig, Antonelli & Hill

ATTORNEYS

INVENTOR
AKIRA MASAKI

BY Craig, Antonelli & Hill
ATTORNEYS

EMITTER-EMITTER COUPLED LOGIC CIRCUIT DEVICE

FIELD OF THE INVENTION

The present invention relates to an emitter-emitter coupled logic circuit, and more particularly to an improvement in the output section thereof.

DESCRIPTION OF THE PRIOR ART

While the transistor-transistor logic circuit (hereinafter referred to as TTL) and diode-transistor logic circuit (hereinafter referred to as DTL) are saturated type logic circuits, the current mode logic circuit (hereinafter referred to as CML) is a non-saturated type logic circuit. Consequently, CML can perform a higher speed logic operation than TTL and DTL. CML includes the emitter coupled logic circuit (hereinafter referred to as ECL) and emitter-emitter coupled logic circuit (hereinafter referred to as $E^2CL$). An ECL comprises a plurality of transistors to the base terminal of each of which an input signal is applied. The emitter terminals and collector terminals of the transistors are respectively connected in common to form a transistor gate which constitutes one of a pair of transistors of a CML. The ECL is disadvantageous in that it performs an unstable logical operation due to a small noise margin when a load is directly driven by an output signal from the collector terminal of the transistor of the CML. In order to overcome this disadvantage it is a common practice to provide an emitter-follower circuit (hereinafter referred to as EF circuit) to the output terminal to drive the load by the output signal of the EF circuit. Even such an improved ECL is still limited in power consumption, temperature dependency and noise margins and $E^2CL$ was proposed to overcome these disadvantages.

The $E^2CL$ comprises a transistor gate composed of a plurality of transistors the emitter terminals of which are connected in common and a current mode logic circuit (CML) consisting of a pair of transistors, the common emitter terminal of the transistor gate being connected to the base terminal of one of the pair of transistors of the CML. The transistor gate performs a logic operation between input signals to the base terminals of the plurality of transistors and delivers the logic output signal from the common emitter terminal to the CML. The $E^2CL$ is characterized in that a load can directly be driven by the output terminal of the CML because the $E^2CL$ is constructed such that a level shift is effected so that the transistor gate provided in the preceding stage of the CML is given a noise tolerance. However, even such an $E^2CL$ still has the disadvantage that its power consumption is large when its load is a transmission line having a relatively small characteristic impedance. The case where the load in a transmission line often occurs when the $E^2CL$ is used, in particular, in a system of an ultra high speed and a high packing as seen in, for example, the bus structure.

An example of the prior art $E^2CL$ in which the load is a transmission line of a low impedance will next be described with reference to FIG. 1. In the following description the higher level of a signal voltage is expressed as a logical "1" and the lower one is expressed as a logical "0".

Figure 1:
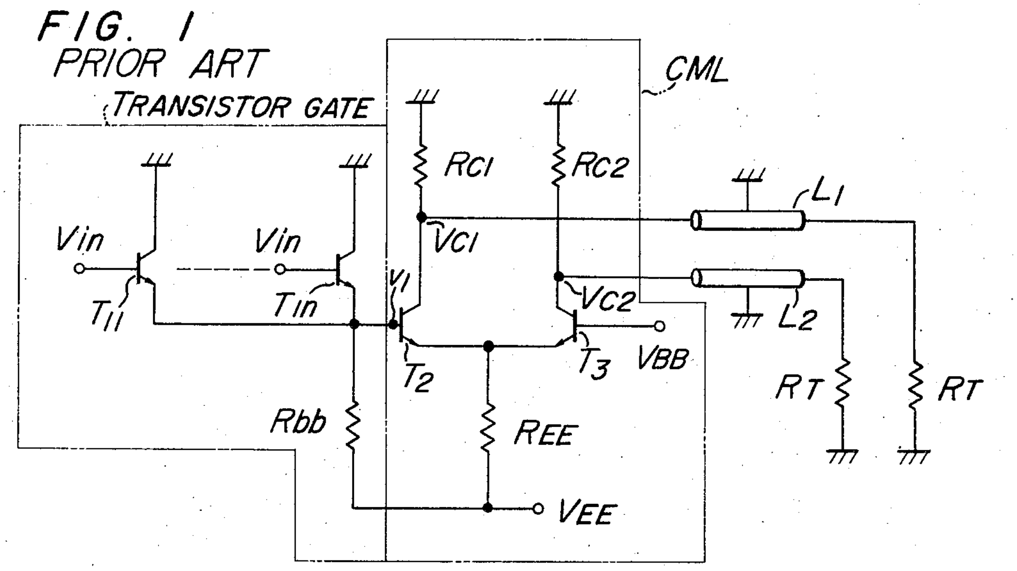
FIG. 1 PRIOR ART
FIG. 1 is a diagram of a prior art emitter-emitter coupled logic circuit.

In FIG. 1, the transistor gate is composed of transistors $T_{11} - T_{1n}$ and the CML is composed of a pair of transistors $T_2$ and $T_3$, a base resistor $R_{bb}$, an emitter resistor $R_{EE}$, collector resistors $R_{c1}$, $R_{C2}$, and an emitter voltage source $V_{EE}$. To the base of the transistor $T_2$ is connected the common emitter terminal of the transistor gate which is the output terminal of the transistor gate. To the base of the transistor $T_3$ is applied a reference voltage $V_{BB}$. If, between the voltage $V_1$ produced at the common emitter of the transistor gate and the reference voltage $V_{BB}$, there is the relation $v_1 > V_{BB}$, the transistor $T_2$ is in a conducting state to produce "0" at the collector terminal $V_{c1}$ of the transistor $T_2$ and "1" at the collector terminal $V_{C2}$ of the transistor $T_3$. On the contrary, if there is the relation $v_1 < V_{BB}$, the transistor $T_3$ is in a conducting state to produce "0" at the collector terminal $V_{C2}$ and "1" at the collector terminal $V_{C1}$. That is, whether "1" or "0" is produced at each collector terminal depends on whether the output voltage $v_1$ is higher or lower than the reference voltage $V_{BB}$.

The loads $L_1$ and $L_2$ to be connected to the collectors of the CML are distributed constant circuit loads such as a transmission line, and the resistors $R_T$ are matching termination resistors having a value equal to the characteristic impedance of the distributed constant circuits $L_1$ and $L_2$.

The power consumption $P_C$ of the CML is $$P_C = I_E \times |V_{EE}| \quad (1)$$

where $I_E$ is an emitter current for the emitter source voltage $V_{EE}$. On the other hand, there is the relation $$R_C \times I_E = V_e \quad (2)$$

among the load resistance $R_C$, the current $I_E$ and the output signal amplitude $V_e$. Since the value of the output signal amplitude $V_e$ is determined at the circuit design stage, it can be regarded as a fixed value. Consequently, there results $$I_E + V_e/R_C \quad (3)$$

Substituting Equation (3) for $I_E$ in Equation (1), the power consumption $P_C$ is expressed as $$P_C = (V_3 \times |V_{EE}|)/R_C \quad (4)$$

When the load is a transmission line of a characteristic impedance $Z_C$, termination must be made with a matching condition $R_T = Z_C$. At this time, if the values of the collector resistors $R_{C1}$ and $R_{C2}$ are assumed to be very high, the value of the resistor $R_C$ may be considered to be $R_T$. Consequently, the power consumption $P_C$ of Equation (4)

$$P_C = (V_e \times |V_{EE}|)/R_T \quad (5)$$

That is, the power consumption $P_C$ is inversely proportional to the value of the termination resistance. As a numerical example, when $V_e$ = 0.8 volts, $|V_{EE}|$ = 4 volts, and $Z_C = 50$ ohms, i.e. $R_T = 50$ ohms, the power consumption $P_C$ is $P_C = 64$ milliwatts. The power consumption of 64 milliwatts is a considerably high value. For example, when a similar load of $Z_C = 50$ ohms is driven by an EF circuit in an ECL with the output "1" being −0.85 volts, the output "1" being −1.65 volts, and the emitter source voltage of the EF circuit being −1.8 volts, an average total of the power consumption of the EF circuits and the external termination resistor is about 20 milliwatts. Thus, the $E^2CL$ consumes a power more than three times as high as that of the ECL at its CML per se. The reason why the CML of the $E^2CL$ consumes such a high power is that the load current directly flows into the emitter voltage source. Further, the $E^2CL$ formed into a monolithic integrated circuit has the disadvantage that the accuracy of the output amplitude is low when a load is externally connected, since the resistance is ordinarily scattered over a range of about ± 20 percent.

SUMMARY OF THE INVENTION

An object of the present invention is to provide an $E^2CL$ which can drive a distributed constant circuit load such as a transmission line with a low power.

The primary reason why the power consumption of the prior art $E^2CL$ shown in FIG. 1 is high is that a load is directly connected to the CML, that is, the load and the CML cannot be electrically isolated.

Therefore, another object of the present invention is to provide an $E^2CL$ in which the CML and the load are electrically isolated from each other.

A further object of the present invention is to provide an $E^2CL$ which can drive a load at a high speed without aggravating the performance of the $E^2CL$ having unsaturability.

According to the present invention the above objects are attained by providing the $E^2CL$ with a buffer circuit to the output terminal of which a load is connected. It is also an important feature of the present invention to provide a saturation-proof diode between the base and collector of the transistor of the circuit so as to operate the transistor of the buffer circuit in a non-saturated state.

DESCRIPTION OF THE PREFERRED EMBODIMENTS

Figure 2:
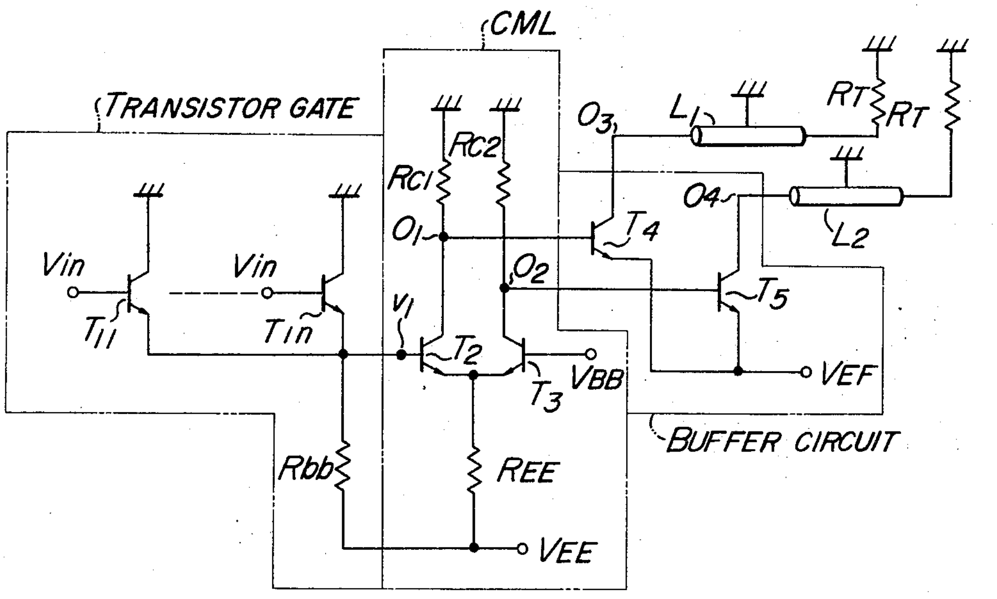
FIG. 2 is a diagram of an embodiment of the emitter-emitter coupled logic circuit according to the present invention.

An embodiment will be described referring to FIG. 2. The $E^2CL$ shown in FIG. 2 is provided at the output of the CML with a buffer circuit consisting of a pair of transistors the bases of which are connected to a pair of output terminals, respectively, of the CML and form a common emitter circuit. However, one of the pair of transistors of said buffer circuit may be omitted. The transistors $T_4$ and $T_5$ are of NPN conductivity type and the emitters thereof are connected to a common voltage source $V_{EF}$. To the collectors of the transistors $T_4$ and $T_5$ are connected transmission line loads $L_1$ and $L_2$, respectively, which are driven by the output signals $O_3$and $O_4$ produced at the collector terminals. The other ends of the loads $L_1$ and $L_2$ are terminated with termination resistors $R_T$ as in the conventional $E^2CL$ of FIG. 1. Although resistors $R_{C1}$ and $R_{C2}$ are grounded in FIG. 1, this fact is not essential. For example, the resistors may be supplied with a positive voltage instead of being grounded. However, the following description will be made, with reference to the case wherein the resistors are grounded, by way of illustration only.

If either one of the input signals $V_{in}$ is at a "1", i.e. substantially at the ground potential, a voltage $v_1$ which is lower than the ground potential by the base-emitter forward voltage drop $V_{BE}$ is produced at the base terminal of the transistor $T_2$. If the circuit is set so that $v_1 > V_{BE}$ stands, the most part of the emitter current $I_E$ flows into the transistor $T_2$ to turn it on, while the current hardly flows into the transistor $T_3$ to put it in a cut-off state. At this time, the output signal $0_1$ of the transistor $T_2$ is $-R_{C1}I_E$ (i.e. "0") and the output signal $0_2$ of the transistor $T_3$ is substantially at the ground potential (i.e.) "1"). If the circuit is set such that the transistor $T_5$ is made conducting by the "1" output signal $0_2$ , the transistor $T_5$ is made conducting by the "1" signal to produce at its collector terminal a signal $0_4$ determined by the collector-emitter voltage $V_{sat}$ at the time of saturation and the emitter source voltage $V_{EF}$. Since the signal $0_4$ is a negative level signal, the "1" input signal is inverted into "0". On the other hand, since the signal $-R_{C1}I$ at the collector terminal of the transistor $T_2$ is set to cut-off the transistor $T_4$, the transistor $T_4$ is cut-off to produce at its collector terminal an output signal $0_3$ substantially equal to zero when the $-R_{C1}I_E$ signal is applied to the transistor $T_4$. The signal $0_3$ is a "1" signal.

When "0" signals are applied to the transistors $T_{11}$ – $T_{1n}$ as the input signals $V_{in}$, a signal $V_C$ which is lower than the input signal $V_{in}$ by the base-emitter forward voltage drop $V_{BE}$ is produced at the base of the transistor $T_2$. If the signal $V_C$ and the reference signal $V_{BB}$ are determined such that $V_C < V_{BB}$, a state which is opposite to the case of the above "1" input signal occurs, that is, the transistor $T_2$ is cut-off while the transistor $T_4$ is conductive to produce "0" at the collector of the transistor $T_4$, and the transistor $T_3$ is conductive while the transistor $T_5$ is cut-off to produce "1" at the collector $T_5$.

Since the above-described embodiment of the present invention employs a buffer circuit, the transmission line loads and the CML are electrically isolated from each other. As a result, the current flowing through the transmission line does not flow into the CML considerably reducing the power consumption of the CML as compared with the conventional $E^2CL$ of FIG. 1. Furthermore, the above mentioned buffer circuit has a signal reproducing ability, and the output amplitude to be supplied to the transmission line load is determined only by the potential at the transistor of said buffer circuit, the collector-emitter forward voltage $V_{sat}$ at the time of saturation of transistor, and the emitter source voltage $V_{EF}$ . Consequently, it is unnecessary for the signal amplitude at the CML to be so accurate, and the emitter source voltage $V_{EE}$ in the present invention can be set at a lower value than that in the conventional $E^2CL$ of FIG. 1. As a result, the power consumption of the CML becomes still smaller.

The present invention has a further advantage that the power consumption $P_1$ of the buffer circuit and the power consumption $P_2$ of the termination resistor section are considerably low. If the signal voltage of the output "0" is expressed as $V_O$ and the signal voltage of the output "1" as $V_1$, then $$P_1 = \left| (V_{out}/R_T)(V_{out} - V_{EF}) \right| \quad (6)$$

$$P_2 = (V_{out}/R_T) V_{out} \quad (7)$$

where $V_{out}$ is either $V_0$ or $v_1$. Consequently, when $V_1 =$ 0 volt, $V_0 = -0.8$ volts, $R_T = 50$ ohms, and $V_{EF} = -1.2$ volts, the signal voltages $P_1$ and $P_2$ are $P_1 = P_2 = 0$ for the output "1" and $P_1 = 6.4$ milliwatts and $P_2 = 12.6$ milliwatts for the output "0". Then, the average power consumed by the buffer circuit is 3.2 milliwatts, the average power consumed by the external termination resistor section is 6.4 milliwatts, and the average overall power consumption is 9.6 milliwatts. Thus, as is apparent from these facts, the power consumption of the output section due to the provision of the buffer circuit is very low. Furthermore, since the stability of the output signal level is high, a noise margin of the same order as that of an ordinary ECL is available even if the output amplitude is made still smaller which results in an advantage that the actual power consumption can be set at a still smaller value. In addition, the fact that the power consumed by the buffer circuit is quite low and contributes greatly to circuit integration.

The problem of the above-described embodiment of the present invention is that, since the transistor of the buffer circuit, is operated in the saturated state, the high speed property of the $E^2CL$ occurring when operated in a non-saturated state is not available. Consequently, another embodiment of the present invention which can perform a high speed operation proper to the $E^2CL$ while attaining a primary objective of a low power consumption will next be described referring to FIG. 3.

Figure 3:
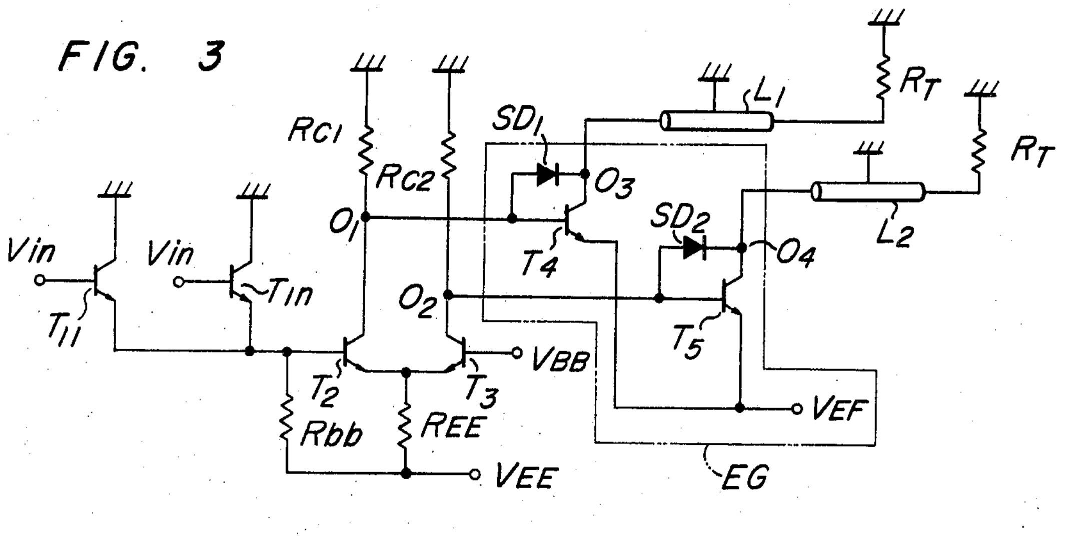
FIG. 3 is another embodiment of the present invention.

FIG. 3 shows an embodiment of the present invention in which the transistors $T_4$ and $T_5$ of the buffer circuit EG are operated in a non-saturated condition. Schottky-barrier diodes $SD_1$ and $SD_2$ are connected between the bases and collectors of the transistors $T_4$ and $T_5$, respectively. The Schottky-barrier diode barely has a carrier storage effect as different from the ordinary PN junction diode, so that it operates in a non-saturated condition.

When the output signal $0_1$ of the transistor $T_2$ is "1", the transistor $T_4$ is in a conducting state. Now, if the base-emitter forward voltage drop of the transistor $T_4$ at its conducting state is expressed by $V_{BE}$, the forward voltage drop of the diode $SD_1$ by $V_F$, and the collector-emitter saturation voltage of the transistor $T_4$ by $V_{sat}$, the condition $$V_{BE} - V_F > V_{sat} \quad (8)$$

is necessary for the transistor $T_4$ not to saturate. Since $v_{BE}$ and $V_{sat}$ are of relatively close values to each other, a diode having a low value of $V_F$ may be selected to satisfy the inequality (8). Typically such diodes are aluminum-silicon Schottky-barrier diodes. In this embodiment the transistor $T_4$ is prevented in its conducting state from saturation by the function of the diode $SD_1$. Incidentally, since the transistor $T_4$ is cut-off in the state of "0", the diode $SD_1$ does not operate in that state. There is a similar relation between the transistor $T_5$ and the diode $SD_2$.

Although Schottky-barrier diodes are employed in the embodiment of FIG. 3, ordinary PN junction diodes may also be employed in their stead when the system is in such a logic operation as that a high current does not flow into the diodes. However, when the system performs such a logic operation as that when a high current flows into the diodes, the diodes themselves are saturated, thereby hindering the high speed operation of the system.

The above arrangement for preventing the buffer circuit from saturation is also an expedient for simultaneously reducing the temperature dependency of the output voltages of the transistors $T_4$ and $T_5$ of the buffer circuit. This is because, when the buffer circuit is in a cut-off state, the output voltage is at the ground potential, thus eliminating the influence of temperature. When the buffer circuit is in a conducting state, the output voltage $V_{out}$ is $$V_{out} = V_{EF} + V_{BE} - V_F \quad (9)$$

where $V_{EF}$ is the constant source voltage. Although both the voltages $V_{BE}$ and $V_F$ are affected by temperature, they are compensated for each other as is evident from the equation (9) since both of them have a negative temperature coefficient. Thus, the output voltage $V_{out}$ of the buffer circuit is hardly affected by temperature.

Figure 4:
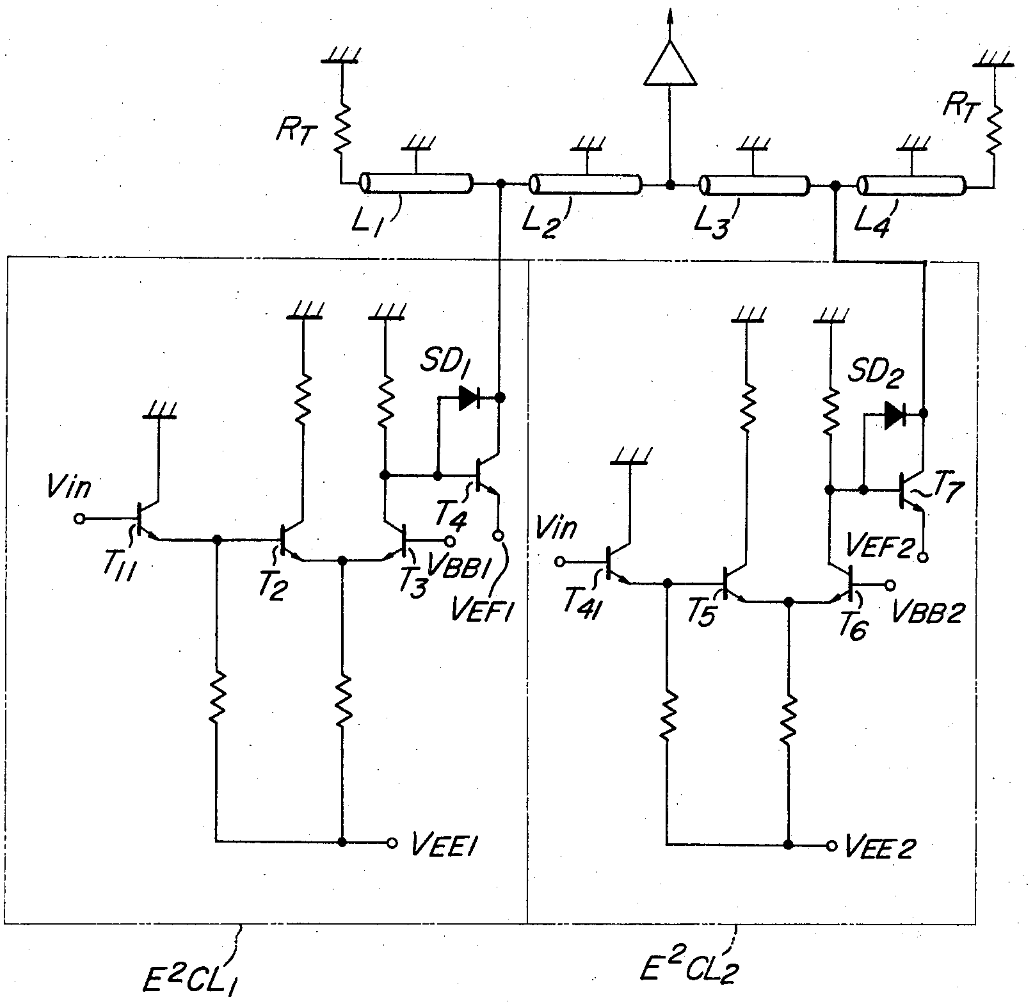

FIG. 4 shows an example of the application of the present invention to a bus structure which uses a signal line for many signals in a time sharing manner. In the example of FIG. 4, only two $E^2CL$'s are operated in time sharing manner by way of description only. Actually many $E^2CL$'s may be operated in time sharing manner.

The output of a first $E^2CL1$ is connected between signal lines $L_1$ and $L_2$, and the output of a second $E^2CL1$ is connected between signal lines $L_3$ and $L_4$. Termination resistors $R_T$ which correspond to the characteristic impedance are connected to the outer ends of the signal lines $L_1$ and $L_4$. Generally, the signal source which has to supply signals to a bus structure, in particular a high speed system requires the following conditions:

1. The output circuit of the signal source must be of a sufficiently high impedance as viewed from the signal line side in the off state. 2. Each end of the signal line must be of matched termination, because the signal line is a distributed constant circuit. Consequently, the output circuit itself must have a sufficient ability to drive such a distributed constant system when the output circuit is in the one state.

For the condition (1), the output circuit in the $E^2CL$ according to the present invention is of a sufficiently high impedance over the used voltage range, because a buffer circuit is used for the output circuit. Consequently, the $E^2CL$ according to the present invention sufficiently meets the first requirement. For the condition (2), since it is an objective of the present invention to drive a distributed constant circuit load such as a transmission line as has been described the second condition is naturally satisfied.

Figure 5:
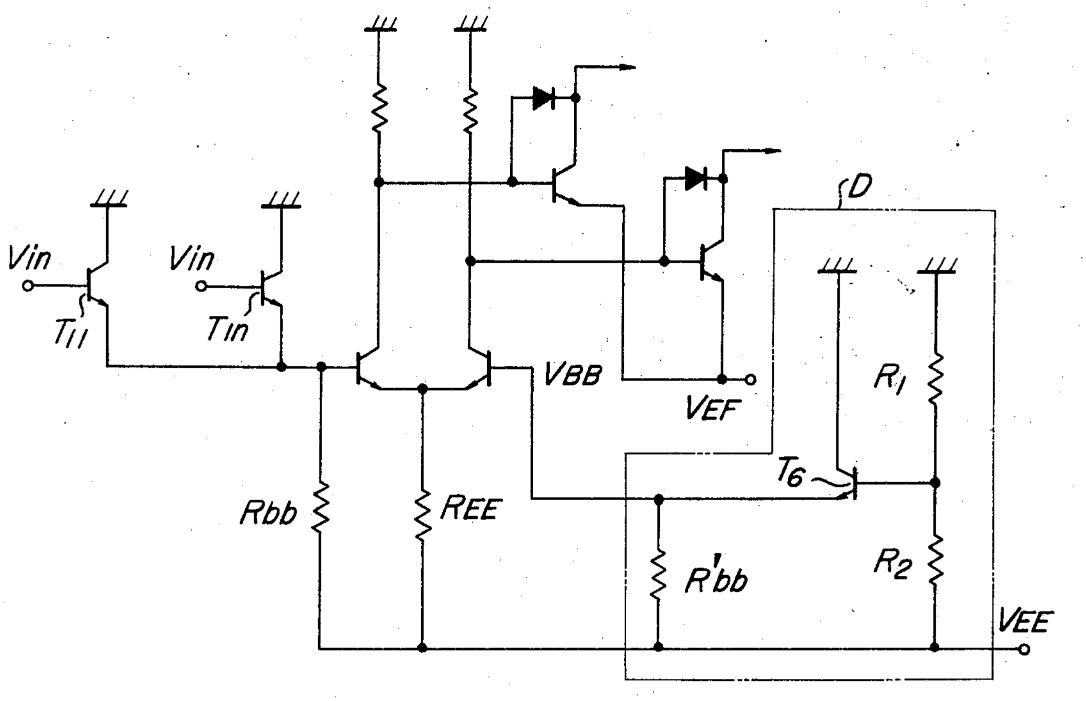
FIGS. 4 and 5 are examples of the application of the present invention.

FIG. 5 shows an example of the application of the present invention to a circuit for supplying a reference voltage to the CML in an integrated circuit. A reference voltage generating circuit D for generating the reference voltage $V_{BB}$ from the emitter source voltage $V_{EE}$ of the CML divides the voltage $V_{EE}$ in the ratio between voltage dividing resistances $R_1$ and $R_2$ to drive an EF transistor $T_6$ which sets the reference voltage $V_{BB}$ by its emitter output voltage. Another feature of the reference voltage generating circuit D is that the base-emitter forward voltage $V_{BE1}$ of the input logic EF circuit and the base-emitter forward voltage $V_{BE2}$ of the transistor $T_6$ have the function of compensating for the influence of temperature. To such a circuit, the $E^2CL$ according to the present invention is applicable.

In addition to the above applications, the present invention can provide a large scale integrated circuit (LSI) of a high speed operation, a low power, and a high ability of driving a load by employing the conventional $E^2CL$ of FIG. 1 as an internal gate of an integrated circuit and by employing a circuit according to the present invention for the output stage gate.

I claim:

1. An emitter-emitter coupled logic circuit device comprising a transistor gate composed of a plurality of transistor to the bases of which input signals are supplied and the emitters of which are connected in common to provide an output signal, a current mode logic circuit comprising a pair of transistors the emitters of which are connected in common to be supplied with an emitter current and having at least one output terminal connected to the collector of a corresponding at least one of said pair of transistors, one of said pair of transistors being connected at its base with said common emitter of said transistor gate to be supplied with said output signal as its input signal, the other of said pair of transistors being supplied at its base with a reference voltage, said pair of transistors being alternately supplied with said emitter current depending on which of said reference voltage and said input signal to the base of said one transistor is higher, a buffer circuit comprising at least one transistor the base of which is connected to a corresponding output terminal of said current mode logic circuit, the emitter of which is supplied with a d.c. voltage, and at the collector of which an output signal is produced, and a transmission line load connected to said collector of said transistor of said buffer circuit, said load being driven by said output signal derived from said collector of said buffer circuit, said load being terminated by a matching resistance having a value equal to the characteristic impedance of said transmission line load.

2. An emitter-emitter coupled logic circuit device according to claim 1, comprising a saturation-proof diode connected between said base and said collector of said transistor of said buffer circuit for preventing the saturation of said transistor of said buffer circuit.

3. An emitter-emitter coupled logic circuit device according to claim 2, in which said diode is a Schottky-barrier diode.

4. An emitter-emitter coupled logic circuit device comprising a plurality of emitter-emitter coupled logic circuits each comprising a transistor gate composed of a plurality of transistors to the bases of which input signals are supplied and the emitters of which are connected in common to provide an output signal, a current mode logic circuit comprising a pair of transistors the emitters of which are connected in common to be supplied with an emitter current and having at least one output terminal connected to the collector of a corresponding at least one of said pair of transistors, one of said pair of transistors being connected at its base with said common emitter of said transistor gate to be supplied with said output signal as its input signal, the other of said pair of transistors being supplied at its base with a reference voltage, said pair of transistors being alternately supplied with said emitter current depending on which of said reference voltage and said input signal to the base of said one transistor is higher, a buffer circuit comprising at least one transistor the base of which is connected to a corresponding output terminal of said current mode logic circuit, the emitter of which is supplied with a d.c. voltage, and at the collector of which an output signal is produced, and a transmission line load each end of which is terminated by a matching resistance which is of the same value as the characteristic impedance of said transmission line, said emitter-emitter coupled logic circuits each having at least one collector output terminal connected to the collector of the respective transistor of said buffer circuit, the collector output terminal of each of said plurality of emitter-emitter coupled logic circuits being connected to an appropriate point of said transmission line, said transmission line load being driven by said plurality of emitter-emitter coupled logic circuit in a time sharing manner.

5. An emitter-emitter coupled logic circuit device according to claim 4, comprising a saturation-proof diode connected between said base and said collector of said transistor of said buffer circuit of each of said plurality of emitter-emitter coupled logic circuits for preventing the saturation of said transistor of said buffer circuit.

6. An emitter-emitter coupled logic circuit device according to claim 5, in which said diode is a Schottky-barrier diode.

* * * * *